United States Patent [19]

Sakai et al.

[11] Patent Number: 5,925,887
[45] Date of Patent: *Jul. 20, 1999

[54] PROJECTION EXPOSURE APPARATUS INCLUDING AN OPTICAL CHARACTERISTIC DETECTOR FOR DETECTING A CHANGE IN OPTICAL CHARACTERISTIC OF A PROJECTION OPTICAL SYSTEM AND DEVICE MANUFACTURING METHOD USING THE SAME

[75] Inventors: Fumio Sakai, Utsunomiya; Kazuhito Outsuka, Tokyo; Yuichi Yamada, Utsunomiya; Kazuhiro Takahashi, Utsunomiya; Yasuo Hasegawa, Utsunomiya; Hideki Nogawa, Utsunomiya; Shinji Utamura, Utsunomiya, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/942,698

[22] Filed: Sep. 30, 1997

Related U.S. Application Data

[63] Continuation of application No. 08/492,543, Jun. 20, 1995, abandoned.

[30] Foreign Application Priority Data

Jun. 24, 1994 [JP] Japan ................................ 6-143328
Sep. 16, 1994 [JP] Japan ................................ 6-221754

[51] Int. Cl.$^6$ .................................................. G01N 21/86
[52] U.S. Cl. .......................................... 250/548; 250/205

[56] References Cited

U.S. PATENT DOCUMENTS

| | | | |
|---|---|---|---|
| 4,506,977 | 3/1985 | Sato et al. | 355/53 |
| 4,666,273 | 5/1987 | Shimizu et al. | 353/101 |
| 4,780,615 | 10/1988 | Suzuki | 250/548 |
| 4,780,616 | 10/1988 | Nishi et al. | 250/548 |
| 5,105,075 | 4/1992 | Ohta et al. | 250/201.2 |
| 5,305,054 | 4/1994 | Suzuki et al. | 355/53 |
| 5,331,369 | 7/1994 | Terasawa et al. | 355/53 |
| 5,337,097 | 8/1994 | Suzuki et al. | 353/101 |
| 5,420,417 | 5/1995 | Shiraishi | 250/205 |
| 5,436,692 | 7/1995 | Noguchi | 355/53 |

FOREIGN PATENT DOCUMENTS

| | | |
|---|---|---|
| 0170013 | 2/1986 | European Pat. Off. . |
| 0526242 | 2/1993 | European Pat. Off. . |
| 60-148115 | 5/1985 | Japan . |

OTHER PUBLICATIONS

Patent Abstracts of Japan, Kokai No. 60–148115, vol. 9, No. 315, Dec. 1985.

*Primary Examiner*—Que Le
*Attorney, Agent, or Firm*—Fitzpatrick, Cella, Harper & Scinto

[57] ABSTRACT

A projection exposure apparatus including a projection optical system for projecting a pattern of a reticle onto a substrate, an optical characteristic detecting device for detecting a change in optical characteristic of the projection optical system, which change may result from the projection of the reticle pattern onto the substrate through the projection optical system, and a light detecting device for detecting at least one of (i) an intensity distribution of light from the reticle pattern, at a position adjacent to the reticle or adjacent to an imaging plane on which the reticle is to be imaged, and (ii) an intensity distribution of the light from the reticle pattern, at a position adjacent to a pupil plane of the projection optical system, wherein the optical characteristic detecting device is arranged to detect the amount of change in optical characteristic in accordance with the intensity distribution detected by the light detecting device.

43 Claims, 5 Drawing Sheets

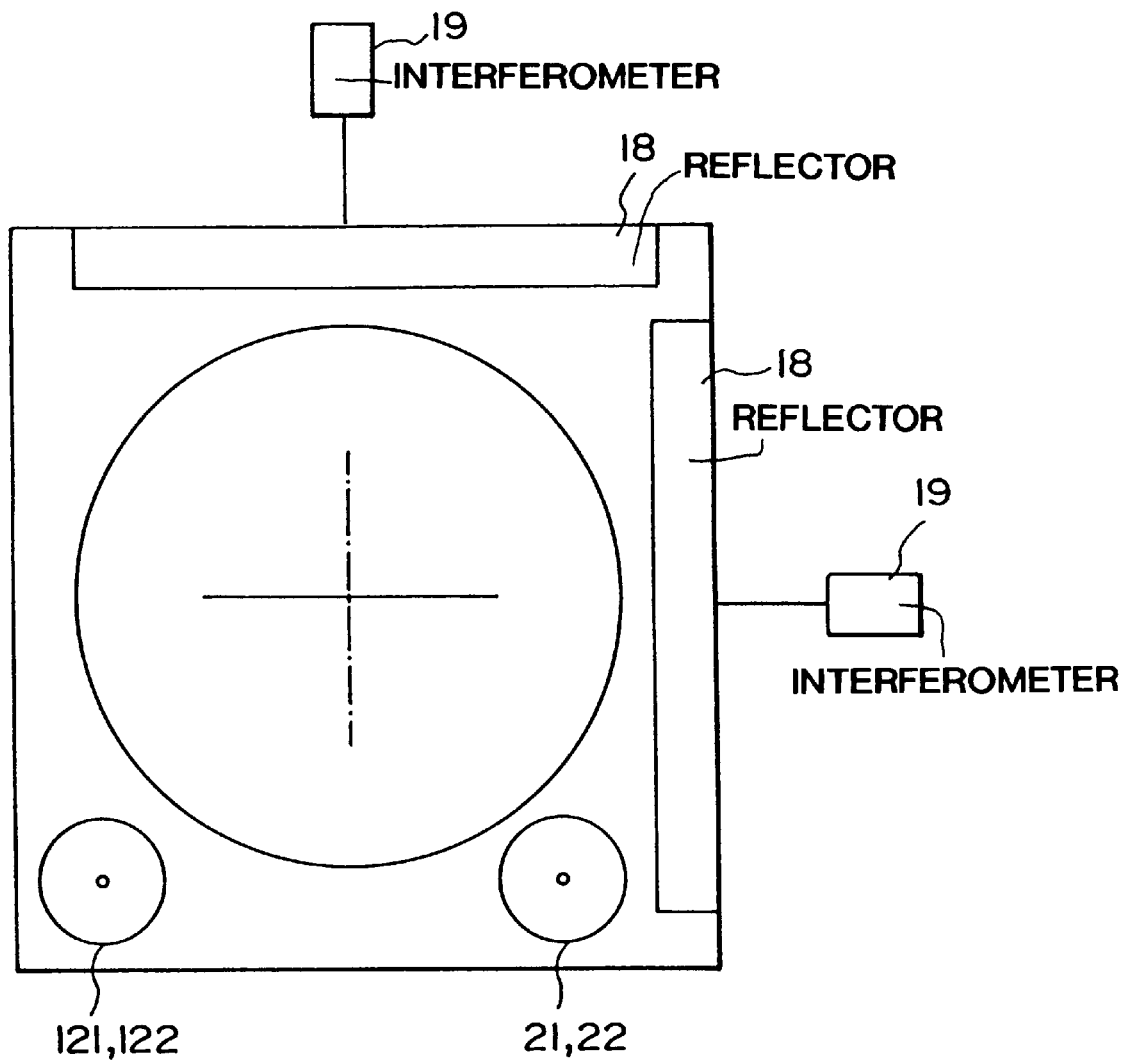
F I G. 2

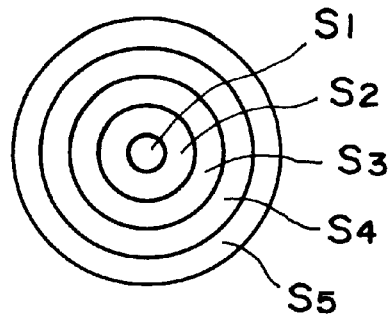
F I G. 3A
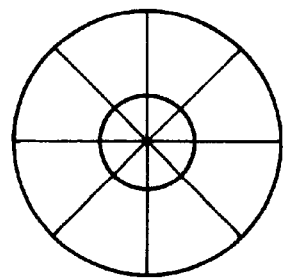
F I G. 3B
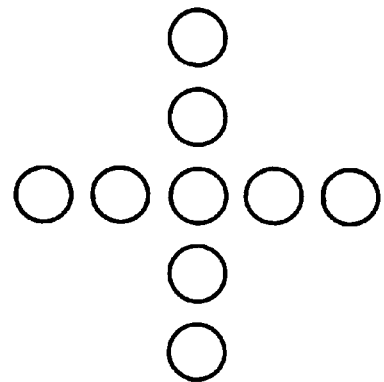
F I G. 3C

PROJECTION EXPOSURE APPARATUS INCLUDING AN OPTICAL CHARACTERISTIC DETECTOR FOR DETECTING A CHANGE IN OPTICAL CHARACTERISTIC OF A PROJECTION OPTICAL SYSTEM AND DEVICE MANUFACTURING METHOD USING THE SAME

This application is a continuation of application Ser. No. 08/492,543, filed Jun. 20, 1995, now abandoned.

FIELD OF THE INVENTION AND RELATED ART

This invention relates to a projection exposure apparatus and a device manufacturing method for manufacturing microdevices such as ICs, LSIs, liquid crystal devices or magnetic heads, for example, by using such a projection exposure apparatus.

In a projection exposure apparatus for the manufacture of semiconductor chips such as ICs or LSIs, for example, during repetitions of projection exposure, a projection optical system absorbs a portion of exposure light energy so that it is heated. The absorbed heat is then radiated. This causes a shift of the position of the imaging plane of the projection optical system or a change of the projection magnification. Such a shift of the imaging plane or change in the projection magnification may be detected on the basis of equations with parameters such as total light quantity passing a reticle pattern, the time consumed for the exposure process and the time between successive exposures in addition to the time constant peculiar to the projection optical system. Then, drive of a wafer stage or drive of a lens or lenses of the projection optical system or the pressure between lenses of the projection optical system may be controlled to correct the shift of the imaging plane or the change of the projection magnification.

However, it has been found that, even if the total light quantity passing the reticle pattern is the same, in a case where a reticle having a pattern of a different type is used or a phase shift reticle is used or, alternatively, in a case where an oblique illumination method is used in an illumination optical system, the light quantity distribution of the optical elements of the projection optical system differs. This results in a different change in the optical characteristic of the projection optical system and, therefore, it is not possible to detect and correct the change of the optical characteristic, such as imaging plane position or projection magnification of the projection optical system, on the basis of the equations as mentioned above. This problem may be attributable to a reason that the light quantity distribution of the optical elements of the projection optical system differs and that the temperature distribution of the projection optical system changes.

SUMMARY OF THE INVENTION

It is an object of the present invention to provide a projection exposure apparatus by which a change in optical characteristic of a projection optical system can be detected and corrected accurately.

It is another object of the present invention to provide a device manufacturing method for manufacturing devices by using such a projection exposure apparatus.

In accordance with an aspect of the present invention, there is provided a projection exposure apparatus, comprising: a projection optical system for projecting a pattern of a reticle onto a substrate; optical characteristic detecting means for detecting a change in optical characteristic of said projection optical system, which change may result from the projection of the reticle pattern onto the substrate through said projection optical system; and light detecting means for detecting at least one of (i) an intensity distribution of light from the reticle pattern, at a position adjacent to the reticle or adjacent to an imaging plane on which the reticle is to be imaged, and (ii) an intensity distribution of the light from the reticle pattern, at a position adjacent to a pupil plane of said projection optical system; wherein said optical characteristic detecting means is arranged to detect the amount of change in optical characteristic in accordance with the intensity distribution detected by said light detecting means.

In accordance with another aspect of the present invention, there is provided a projection exposure apparatus, comprising: a projection optical system for projecting a pattern of a reticle onto a substrate; optical characteristic detecting means for detecting a change in optical characteristic of said projection optical system, which change may result from the projection of the reticle pattern onto the substrate through said projection optical system; optical characteristic correcting means for substantially correcting the change in optical characteristic of said projection optical system in accordance with an output of said optical characteristic detecting means; and light detecting means for detecting at least one of (i) an intensity distribution of light from the reticle pattern, at a position adjacent to the reticle or adjacent to an imaging plane on which the reticle is to be imaged, and (ii) an intensity distribution of the light from the reticle pattern, at a position adjacent to a pupil plane of said projection optical system; wherein said optical characteristic detecting means is arranged to detect the amount of change in optical characteristic in accordance with the intensity distribution detected by said light detecting means.

In one preferred form of the invention, said optical characteristic detecting means is arranged to detect at least one of the amount of change of said imaging plane of said projection optical system and the amount of change of projection magnification.

In another preferred form of the invention, said optical characteristic correcting means is arranged to correct at least one of the amount of change in said imaging plane of said projection optical system and the amount of change in projection magnification.

Preferably, said optical characteristic detecting means and said optical characteristic correcting means are arranged to detect and correct the change of said imaging plane of said projection optical system and the change of projection magnification thereof.

In a further preferred form of the invention, said light detecting means includes first light detector means having a light detecting surface adjacent to said imaging plane of said projection optical system, for detecting a light intensity distribution adjacent to the reticle, and second light detector means having a light detecting surface at a position away from said imaging plane of said projection optical system, for detecting a light intensity distribution adjacent to the pupil plane of said projection optical system.

In a still further preferred form of the invention, said light detecting means includes a light blocking plate with a pinhole disposed adjacent to said imaging plane, and a plurality of photoelectric converting elements arrayed at a position away from said imaging plane for detecting light passing through the reticle pattern and through said projection optical system and coming from said light blocking plate, wherein the light intensity distribution adjacent to the pupil plane of said projection optical system is determined on the basis of an output distribution of said photoelectric converting elements, wherein the light intensity adjacent to the reticle is determined on the basis of the sum of outputs of said photoelectric converting elements, and wherein said light blocking plate and said photoelectric converting elements are movable as a unit along said imaging plane.

In yet a further aspect of the present invention, a projection exposure apparatus such as discussed above is used to print a device pattern of a reticle on a workpiece such as a silicon wafer or a glass substrate, for example, for accurate manufacture of devices such as ICs, LSIs, CCDs, liquid crystal elements or magnetic heads, for example.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a plan view for explaining a modified form of the projection exposure apparatus of FIG. 1.

FIGS. 3A, 3B and 3C are schematic views for explaining examples of a split sensor.

DESCRIPTION OF THE PREFERRED EMBODIMENTS

Figure 1:
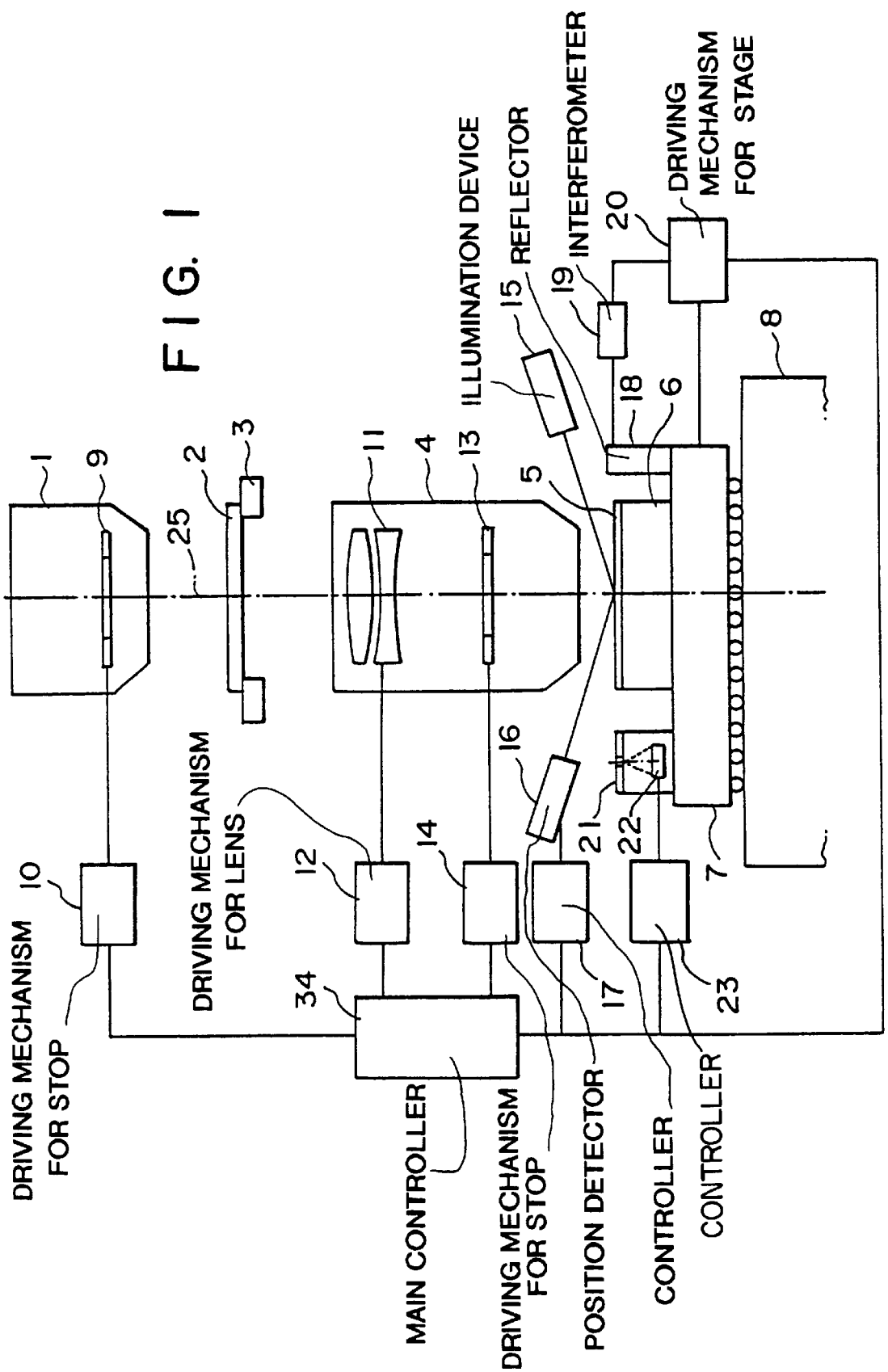
FIG. 1 is a schematic view of a projection exposure apparatus according to one embodiment of the present invention.

FIG. 1 is a schematic view showing one embodiment of the present invention, wherein the invention is applied to a step-and-repeat type projection exposure apparatus for the manufacture of microdevices such as ICs, LSIs, CCDs, liquid crystal elements or magnetic heads, for example.

Denoted in FIG. 1 at 1 is an illumination system, and denoted at 2 is a reticle having a device pattern formed thereon. Denoted at 3 is a reticle stage, and denoted at 4 is a projection lens system for projecting the device pattern of the reticle 2 in a reduced scale. Denoted at 5 is a wafer on which the device pattern of the reticle is to be transferred or printed, and denoted at 6 is a wafer chuck for holding the wafer 5. The wafer chuck 6 is movable along the direction of an optical axis 25. Denoted at 7 is an X-Y stage for holding the wafer chuck 6. The X-Y stage 7 is movable two-dimensionally along a plane perpendicular to the optical axis 25. Denoted at 8 is a base on which the projection lens system 4 and the X-Y stage 7, for example, are mounted.

Denoted at 9 is a stop of the illumination system 1. The stop 9 has an opening which is variable in size and in shape. Denoted at 10 is a driving mechanism for changing the size or shape of the opening of the stop 9, to thereby change the numerical aperture (N.A.). Denoted at 11 is a certain lens of the projection lens system 4, which lens 11 is movable along the optical axis 25 direction. Denoted at 12 is a driving mechanism for moving and displacing the lens 11 along the optical axis 25 direction, to thereby change the projection magnification of the projection lens system 4. Denoted at 13 is a stop (pupil) of the projection lens system 4. The stop 13 is at a position optically conjugate with the stop 9. The stop 13 has an opening which is variable in size. Denoted at 14 is a driving mechanism for changing the size of the opening of the stop 13, to thereby change the numerical aperture (N.A.).

Denoted at 15 and 16 are components for detecting the position (level) of the wafer 5 surface with respect to the optical axis 25 direction. More specifically, denoted at 15 is an illumination device for illuminating the wafer 5, and denoted at 16 is a light receiving device for receiving reflected light from the wafer 5 surface and for producing a signal corresponding to the position of the wafer 5 surface. Denoted at 17 is a controller for controlling the components 15 and 16.

Denoted at 18 is a reflector fixedly mounted on the X-Y stage 7, and denoted at 19 is a laser interferometer for projecting a laser beam to the reflection surface of the reflector 18 and for detecting the amount of displacement of the X-Y stage 7. Denoted at 20 is a driving mechanism for controlling movement of the X-Y stage 7 in response to the output of the laser interferometer.

The driving mechanism 20 receives information related to the level of the wafer 5 surface, from the controller 17. Then, it serves to move the wafer chuck 6 along the optical axis direction, such that the wafer 5 surface is brought into registration with the imaging plane on which the device pattern of the reticle 2 is to be imaged by the projection lens system 4.

Denoted at 21 is a light blocking plate having a central pinhole, and denoted at 22 is an array of photoelectric converting elements such as CCDs (the array hereinafter will be referred to as "CCD 22"). The light blocking plate 21 is so set that the surface thereof is at the same level of the wafer 5 surface, and it is disposed adjacent to the imaging plane of the device pattern of the reticle 2 through the projection optical system 4. The CCD 22 is disposed at a position which is below and is at a predetermined distance from the light blocking plate 21, so that it receives the light passing through the pinhole of the light blocking plate 21.

The CCD 22 is at a position spaced away from the imaging plane of the reticle device pattern. This position is such a position about which a light intensity distribution that corresponds to the light intensity distribution of diffraction light from the device pattern of the reticle 2 as produced at the opening of the stop 13 of the projection optical system 4, is produced. The light blocking plate 21 and the CCD 22 are fixedly mounted on the X-Y stage 7 as a unit therewith. Thus, by moving the X-Y stage 7, the pinhole of the light blocking plate 21 is positioned sequentially at different positions within the imaging plane and, thus, detection of light intensity or light intensity distribution is enabled at these positions.

Denoted at 23 is a controller which serves to drive the CCD 22, to receive outputs from the CCD 22, to detect the light intensity distribution of the device pattern image as formed on the imaging plane (which corresponds to the intensity distribution, adjacent to the reticle 2, of the light passed through the device pattern of the reticle 2) and to detect the light intensity distribution at the opening of the stop 13 as formed on the light receiving surface of the CCD 22 (which corresponds to the light intensity distribution at the pupil of the projection optical system 4).

The light intensity distribution of the device pattern image is detected by moving the X-Y stage 7 to sequentially place the pinhole of the light blocking plate 21 at different positions within the imaging plane of the device pattern and by detecting the sum of outputs of the picture elements of the CCD 22 at these positions. The light intensity distribution at the opening of the stop 13 is detected by moving the X-Y stage 7 to sequentially place the pinhole of the light blocking plate 21 at different positions within the imaging plane of the device pattern and by detecting an average of the light intensity distributions obtainable from the outputs of the CCD 22 at these positions.

In addition to the light intensity distribution of the device pattern image, the controller 23 produces, from the outputs of the CCD 22, the information related to the total light quantity of the light passed through the device pattern of the reticle 2.

Denoted at 34 is a main controller for controlling the elements denoted at 10, 12, 14, 17, 20 and 23. Various data such as the information related to the open and closed periods of an exposure controlling shutter (not shown) of the illumination system 1 (that is, the time period t consumed for the exposure and time period t' between successive exposure periods), the information related to the light intensity distribution of the device pattern image from the controller 23, and the information related to the light intensity distribution at the opening of the stop 13 from the controller 23, are all applied to this main controller 24.

As a reticle 2 is set in the exposure apparatus of FIG. 1 and the size and shape of each of the stops 9 and 13 are determined by the mechanism 12 or 14 and when the exposure process is repeatedly performed to different shots of a wafer 5 and then to successive wafers, the controller 24 calculates a change $\Delta F$ of the position of the imaging plane of the device pattern through the projection optical system 4 resulting from the repetition of exposures as well as a change $\Delta \beta$ of the device pattern projection magnification of the projection lens system 4 also resulting from the repetition of exposures, this being performed in accordance with equations (1) and (2) below. This calculation is done by using equations which are obtainable by modifying conventionally used correction equations by adding parameters dependent upon the light intensity distribution of diffraction light.

$$\Delta F = \Delta F1 + \Delta F2$$

$$\Delta F1 = SF \cdot QD \cdot Da \cdot Db \cdot DT$$

$$\Delta F2 = -\Delta F' \cdot exp(-K_F \cdot t) \ldots \quad (1)$$

$$\Delta \beta = \Delta \beta 1 + \Delta \beta 2$$

$$\Delta \beta 1 = SB \cdot QD \cdot Da \cdot Db \cdot DT$$

$$\Delta \beta 2 = -\Delta \beta' \cdot exp(-K_B \cdot t) \ldots \quad (2)$$

In these equations, SF and SB are proportional constants; QD is a parameter corresponding to the total quantity of light passed through the device pattern; Da is a parameter dependent upon the light intensity distribution of the device pattern image (i.e., the distribution of light transmissivity of the device pattern of the reticle 2); Db is a parameter dependent upon the light intensity distribution at the opening of the stop 13 (i.e., the light intensity distribution at the pupil plane of the projection optical system 4, of the light from the reticle 2); $K_F$ and $K_B$ are parameters which represent the heat conductivity of the projection lens system 4; DT is the ratio of a time period, within unit time in calculation, in which period the shutter is kept open; $\Delta F'$ and $\Delta \beta'$ are the amount of change of the imaging plane and the amount of change of the magnification, respectively, of the projection lens system as calculated in the preceding unit time just before; $\Delta F1$ and $\Delta \beta 1$ each is the amount of change per unit time of the projection lens system due to heat absorption; and $\Delta F2$ and $\Delta \beta 2$ each is the amount of change per unit time of the projection lens system 4 due to heat radiation. The changes $\Delta F2$ and $\Delta \beta 2$ may be expressed in the form of linear coupling of plural terms. The values of Da and Db may be determined beforehand, through experiments, for example, in relation to various light intensity distributions to be produced by the controller 23. The thus determined data may be stored into the controller 24, such that a corresponding one of the stored ones in the controller 24 may be used.

Variables Da and Db may be determined by calculation, using calculation formula memorized in the controller 34. Such calculation formula may be determined by experiments, for example, using several typical type reticles. As an example, as for the formula in relation to the variable Db, the following equation may be used:

$$Db = (aE_1 + bE_2 + cE_3 + dE_4 + eE_5)/(E_1 + E_2 + E_3 + E_4 + E_5)$$

The above equation may be used on an occasion where the light intensity distribution at the opening of the stop 13 is detected by using a split sensor (FIG. 3A) to be described later or in a case where five split zones are defined in the light receiving surface of the CCD 22 (such as the split sensor illustrated in FIG. 3A) so that evaluation of the light intensity distribution at the opening of the stop 13 may be done with respect to each zone. In the equation above, $E_1$, $E_2$, $E_3$, $E_4$ and $E_5$ represent the magnitudes of the outputs (light intensities) as produced by the photoelectric converting portions $S_1$, $S_2$, $S_3$, $S_4$ and $S_5$ of the split sensor of FIG. 3A. Also, symbols a, b, c, d, and e are coefficients. The values of these coefficients a, b, c, d and e may be determined from an experimentally determined parameter Db and a value of data related to $E_1$, $E_2$, $E_3$, $E_4$ and $E_5$ and by applying the least square method to this equation.

As regards the calculation formula related to the variable Da, a similar equation related to the light transmissivity distribution of the device pattern of the reticle 2 may be used.

At every unit time, the calculation is performed. Thus the calculation is repeated. Therefore, the amount of change as obtainable from the calculation changes along a curve whose envelope can be represented by a function of a natural logarithm.

In the embodiment, every time a shot on the wafer 5 is exposed, the error $\Delta F$ of the position of the imaging plane of the device pattern and the error $\Delta \beta$ of the projection magnification of the device pattern are calculated by using equations (1) and (2) above. Then, by using the components 12, 17 and 20, the position of the lens 11 and/or the position of the wafer 5 surface is adjusted so as to correct the error $\Delta F$ of the position of the imaging plane of the device pattern and the error $\Delta \beta$ of the projection magnification. The surface of the wafer 5 is thus brought into the position corresponding to the result of adding the error $\Delta F$ to the original position of the imaging plane of the device pattern of the projection lens system 4.

In this embodiment, detection of the total light quantity of the light passed through the device pattern of the reticle 2, and detection of the distribution of the light transmissivity of the device pattern of the reticle 1 (the light intensity distribution of the device pattern image) as well as detection of the intensity distribution at the pupil plane of the projection lens system 4 of the light from the device pattern of the reticle 2 (i.e., the light intensity distribution at the opening of the stop 13), are all performed every time the reticle 2 is replaced by a different reticle having a different device pattern. The parameters obtainable from the results are stored into the controller 24 as reticle data related to the reticle used. After this, when the same reticle is loaded into the exposure apparatus, corresponding data having been memorized is read out and is used for the calculation of the error ΔF of the position of the imaging plane and the error Δβ of the projection magnification.

In this embodiment, as described above, for calculation of the error ΔF in the position of the imaging plane and the error Δβ in the magnification, parameters dependent upon the light intensity distribution of the device pattern image (distribution of the light transmissivity of the device pattern of the reticle 2) as well as parameters Db dependent upon the light intensity distribution at the opening of the stop 13 (light intensity distribution at the pupil plane of the projection lens system 4 of the light from the reticle 2) are used. It is therefore possible to obtain exact values of the change ΔF of position of the imaging plane and the change Δβ of magnification, while taking into account the intensity distribution of the light which comes from the reticle pattern and enters the projection optical system. As a result, it is possible to perform the projection exposure while accurately correcting the change in position of the imaging plane and the change in projection magnification.

The error ΔF in position of the imaging plane of the device pattern and the error Δβ in projection magnification may be corrected by using a known method. For example, the error ΔF in position of the imaging plane may be corrected by changing the focal length of the projection lens system 4 or by moving, upwardly or downwardly, the reticle 2 and the projection lens system 4 as a unit along the optical axis 25 direction. The error Δβ of projection magnification may be corrected by changing the focal length of the projection lens system 4 or by moving the reticle 2 upwardly or downwardly along the optical axis 25 direction. For changing the focal length of the projection lens system 4, a particular lens or lenses of the projection lens system 4 may be displaced along the optical axis 25 or, alternatively, the interspace between adjacent lenses of the projection lens system 4 may be shielded to provide a gas-tight chamber (air lens) and the inside pressure of-the chamber may be changed.

In this embodiment, both a change in position of the imaging plane and a change in projection magnification of a projection optical system are detected and corrected. However, only one of them may be detected and corrected.

Further, while in this embodiment a change in position of the imaging plane of the device pattern and a change in projection magnification are detected and corrected, the concept of the present invention is applicable also to detection and correction of a change in aberration of a projection optical system such as curvature of image field, for example.

Furthermore, in the embodiment described above, both distribution of light transmissivity of a device pattern of a reticle 2 and intensity distribution at the pupil plane of the projection lens system 4 of the light from the device pattern of the reticle 2 are performed and then error calculation is performed by using both the parameters Da and Db. However, only one of these intensity distributions may be detected and the error calculation may be done by using only one of these parameters. On that occasion, the other parameter may be held fixed at one or any other value.

Still further, while in this embodiment the projection lens system 4 is used for projection of a device pattern, the invention is also applicable to a case where a projection mirror system is used for projection of a device pattern or a case where a projection mirror and lens system (catadioptric system) is used for projection of a device pattern.

Also, while in this embodiment the invention is applied to a step-and-repeat type projection exposure apparatus, the invention is applicable also to a step-and-scan type scanning projection exposure apparatus.

The intensity distribution at the pupil plane of the projection lens system 4 of the light from the device pattern may be detected by changing the size of the opening of the stop 13 sequentially and stepwise by using the mechanism 14 and then by detecting the total sum of the outputs of the elements of the CCD 22 in each step. In that occasion, the CCD 22 may be replaced by a photodiode.

As regards the CCD 22, either a one-dimensional CCD array or a two-dimensional CCD array may be used. A line sensor may be used in place of a one-dimensional CCD. A split sensor such as illustrated in FIG. 3A, 3B or 3C may be used in place of a two-dimensional CCD.

The light from the pinhole of the light blocking plate 21 may not be received directly. It may be received by way of an optical fiber or a lens, for example. If a lens is to be used, preferably a lens which is adapted to image the stop 13 upon the light receiving surface of the CCD 22 may be used.

Further, the structure may be modified as illustrated in FIG. 2. That is, a first light detector which comprises a light blocking plate 21 with a pinhole and a CCD 22 as well as a second light detector which comprises a light blocking plate 121 with a pinhole and a photodiode 122, may be provided on the X-Y stage 7. The intensity distribution at the pupil plane of the projection lens system 4 of the light from the device pattern may be detected by means of the first light detector (21, 22), while the light intensity distribution of the device pattern image of the reticle 2 may be detected by means of the second light detector (121, 122). The outputs of these light detectors may be applied to the controller 23 of FIG. 1.

Next, an embodiment of a device manufacturing method according to the present invention, for manufacturing devices by using a projection exposure apparatus according to any one of the preferred forms of the present invention, will be explained.

Figure 4:
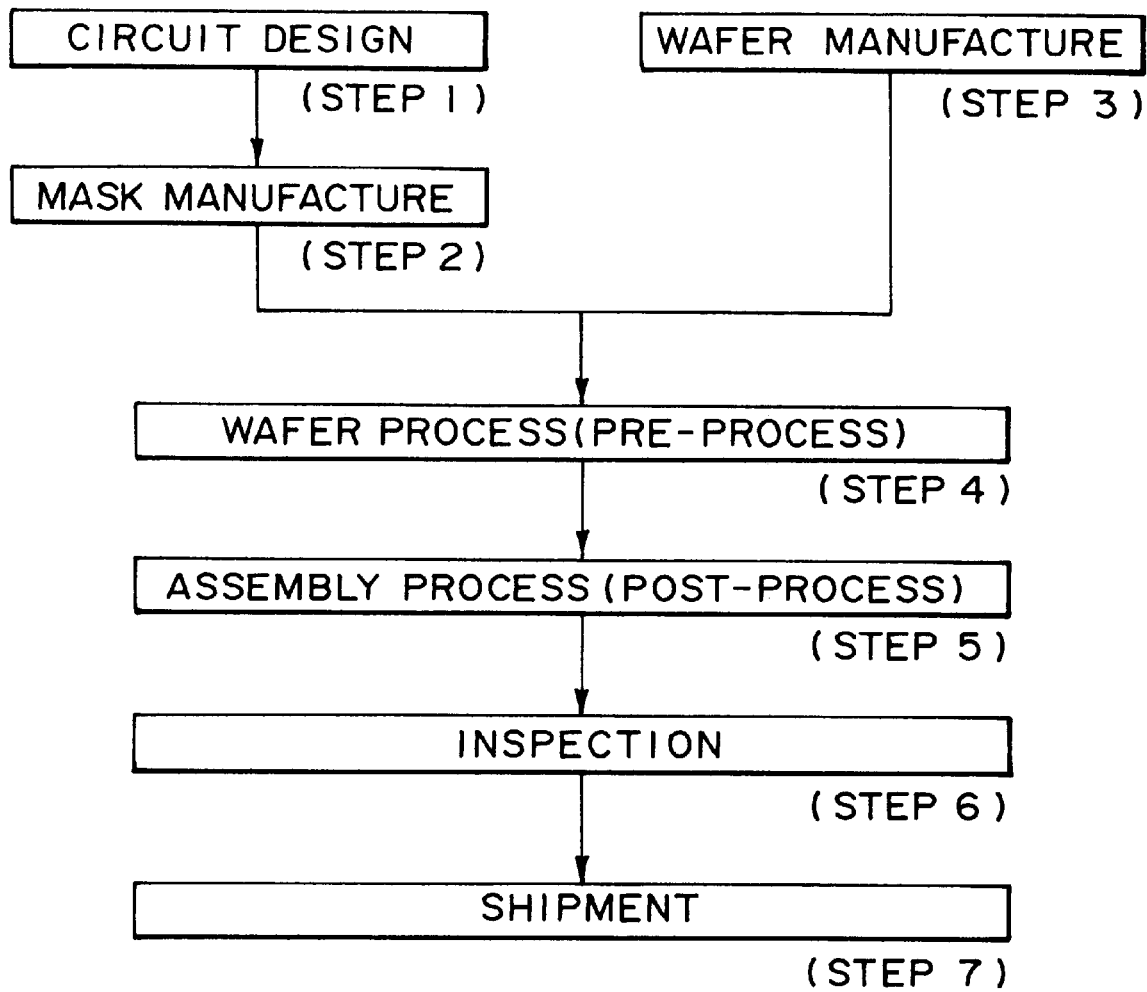
FIG. 4 is a flow chart of device manufacturing processes.

FIG. 4 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 5:
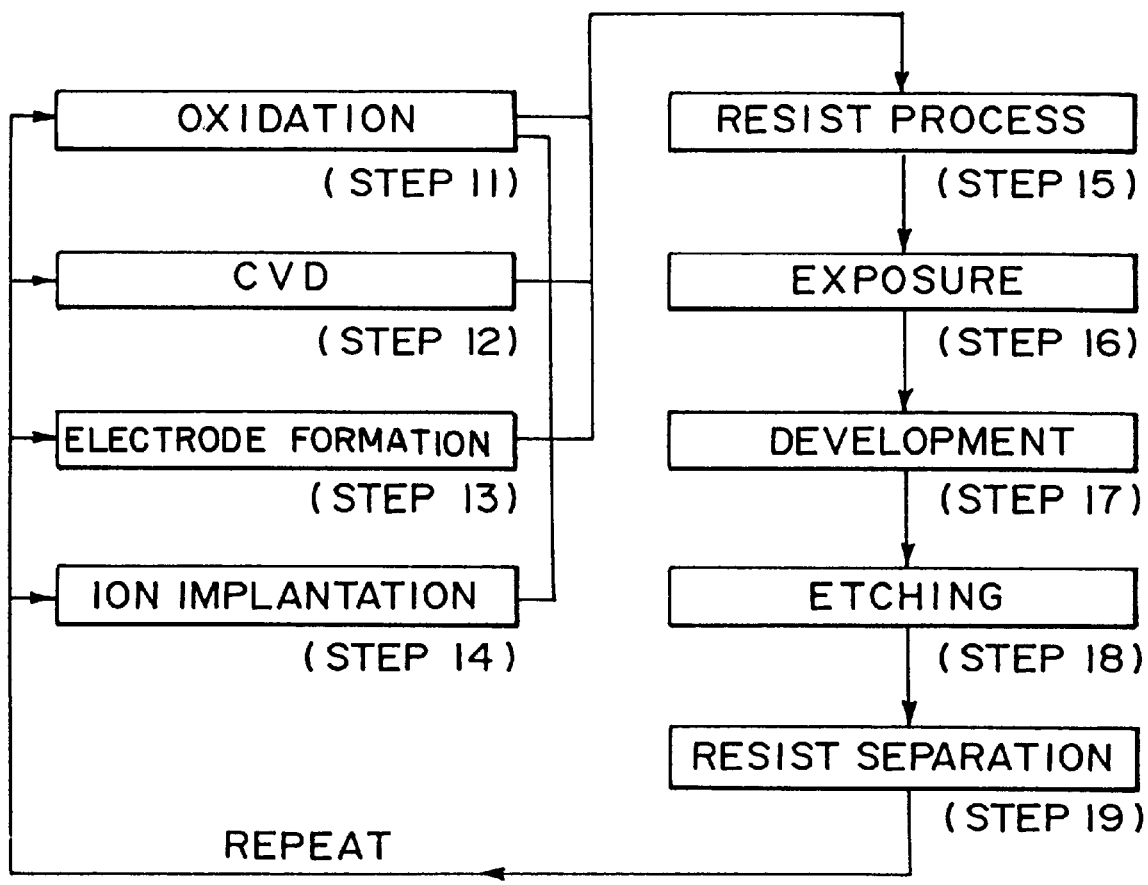
FIG. 5 is a flow chart of a wafer process in a portion of the flow chart of FIG. 4.

FIG. 5 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

an illumination optical system for illuminating a reticle;

a projection optical system for projecting a pattern of the reticle onto a substrate;

optical characteristic detecting means for detecting a change in optical characteristic of said projection optical system due to the projection of the reticle pattern onto the substrate through said projection optical system; and light detecting means for detecting an intensity distribution of the light from the reticle pattern on a pupil plane of said projection optical system, wherein said optical characteristic detecting means detects the amount of change in optical characteristic in accordance with the intensity distribution detected by said light detecting means.

2. An apparatus according to claim 1, wherein said light detecting means detects an intensity distribution on the reticle.

3. An apparatus according to claim 1, wherein said optical characteristic detecting means detects at least one of the amount of change of an imaging plane of said projection optical system and the amount of change of projection magnification of said projection optical system.

4. An apparatus according to claim 2, wherein said light detecting means comprises a light blocking plate with a pinhole disposed at the imaging plane, and a plurality of photoelectric converting elements arrayed at a position away from the imaging plane for detecting light passing through the reticle pattern, through said projection optical system and through the pinhole of said light blocking plate, wherein the light intensity distribution on the pupil plane of said projection optical system is determined on the basis of an output distribution of said photoelectric converting elements, wherein the light intensity on the reticle is determined by using the sum of outputs of said photoelectric converting elements, and wherein said light blocking plate and said photoelectric converting elements are movable as a unit along the imaging plane.

5. An apparatus according to claim 2, wherein said light detecting means comprises first light detector means having a light detecting surface disposed at the imaging plane of said projection optical system, for detecting the light intensity distribution on the reticle, and second light detector means having a light detecting surface disposed at a position away from the imaging plane of said projection optical system, for detecting the light intensity distribution on the pupil plane of said projection optical system.

6. A projection exposure apparatus comprising:

an illumination optical system for illuminating a reticle;

a projection optical system for projecting a pattern of the reticle onto a substrate;

optical characteristic detecting means for detecting a change in optical characteristic of said projection optical system due to the projection of the reticle pattern onto the substrate through said projection optical system;

light detecting means for detecting an intensity distribution of the light from the reticle pattern on a pupil plane of said projection optical system, wherein said optical characteristic detecting means detects the amount of change in optical characteristic in accordance with the intensity distribution detected by said light detecting means; and optical characteristic correcting means for substantially correcting the change in optical characteristic of said projection optical system in accordance with an output of said optical characteristic detecting means.

7. An apparatus according to claim 6, wherein said light detecting means detects an intensity distribution on the reticle.

8. An apparatus according to claim 6, wherein said optical characteristic detecting means detects at least one of (i) the amount of change of an imaging plane of said projection optical system and (ii) the amount of change of projection magnification of said projection optical system.

9. An apparatus according to claim 7, wherein said light detecting means comprises first light detector means having a light detecting surface disposed at the imaging plane of said projection optical system, for detecting the light intensity distribution on the reticle, and second light detector means having a light detecting surface disposed at a position away from the imaging plane of said projection optical system, for detecting the light intensity distribution on the pupil plane of said projection optical system.

10. An apparatus according to claim 7, wherein said light detecting means comprises a light blocking plate with a pinhole disposed at the imaging plane, and a plurality of photoelectric converting elements arrayed at a position away from the imaging plane for detecting light passing through the reticle pattern through said projection optical system and through the pinhole of said light blocking plate, wherein the light intensity distribution on the pupil plane of said projection optical system is determined on the basis of an output distribution of said photoelectric converting elements, wherein the light intensity on the reticle is determined by using the sum of outputs of said photoelectric converting elements, and wherein said light blocking plate and said photoelectric converting elements are movable as a unit along the imaging plane.

11. An apparatus according to claim 8, wherein said optical characteristic correcting means performs one of (i) moving the reticle and said projection optical system along an optical axis direction and (ii) moving the substrate along the optical axis direction to thereby correct the change of the imaging plane and to register the surface of the substrate and the imaging plane.

12. An apparatus according to claim 8, wherein said optical characteristic correcting means changes a focal distance of said projection optical system to correct the change of the imaging plane and to register the surface of the substrate and the imaging plane.

13. An apparatus according to claim 8, wherein said optical characteristic correcting means moves one of the reticle and a lens of said projection optical system along an optical axis direction to correct the change of the projection magnification.

14. An apparatus according to claim 8, wherein said optical characteristic correcting means chances a focal distance of said projection optical system to correct the change in the projection magnification.

15. A projection exposure apparatus comprising:
an illumination optical system for illuminating a reticle;
a projection optical system for projecting a pattern of the reticle onto a substrate; and
optical characteristic detecting means for detecting a change in optical characteristic of said optical system due to the projection of the reticle pattern onto the substrate through said projection optical system, wherein said optical characteristic detecting means comprises light detecting means for detecting an intensity distribution of the light from the reticle pattern on a pupil plane of said projection optical system, and detects the amount of change in optical characteristic in accordance with the intensity distribution detected by said light detecting means.

16. An apparatus according to claim 15, wherein said light detecting means detects an intensity distribution on the reticle.

17. An apparatus according to claim 15, wherein said optical characteristic detecting means detects at least one of (i) the amount of change of an imaging plane of said projection optical system and (ii) the amount of change of projection magnification of said projection optical system.

18. An apparatus according to claim 16, wherein said light detecting means comprises first light detector means having a light detecting surface disposed at the imaging plane of said projection optical system, for detecting the light intensity distribution on the reticle, and second light detector means having a light detecting surface disposed at a position away from the imaging plane of said projection optical system, for detecting the light intensity distribution on the pupil plane of said projection optical system.

19. An apparatus according to claim 16, wherein said light detecting means comprises a light blocking plate with a pinhole disposed at the imaging plane of said projection optical system, and a plurality of photoelectric converting elements arrayed at a position away from the imaging plane for detecting light passing through the reticle pattern, through said projection optical system and through the pinhole of said light blocking plate, wherein (i) the light intensity distribution on the pupil plane of said projection optical system is determined on the basis of an output distribution of said photoelectric converting elements, (ii) the light intensity on the reticle is determined by using the sum of outputs of said photoelectric converting elements, and (iii) said light blocking plate and said photoelectric converting elements are movable as a unit along the imaging plane.

20. A projection exposure apparatus comprising:
an illumination optical system for illuminating a reticle;
a projection optical system for projecting a pattern of the reticle onto a substrate;
optical characteristic detecting means for detecting a change in optical characteristic of said projection optical system due to the projection of the reticle pattern onto the substrate through said projection optical system, wherein said optical characteristic detecting means comprises light detecting means for detecting an intensity distribution of the light from the reticle pattern on a pupil plane of said projection optical system, and detects the amount of change in optical characteristic in accordance with the intensity distribution detected by said light detecting means; and
optical characteristic correcting means for substantially correcting the change in optical characteristic of said projection optical system in accordance with an output of said optical characteristic detecting means.

21. An apparatus according to claim 20, wherein said light detecting means detects an intensity distribution on the reticle.

22. An apparatus according to claim 20, wherein said optical characteristic detecting means detects at least one of (i) the amount of change of an imaging plane of said projection optical system and (ii) the amount of change of projection magnification of said projection optical system.

23. An apparatus according to claim 21, wherein said light detecting means comprises first light detector means having a light detecting surface disposed at the imaging plane of said projection optical system, for detecting the light intensity distribution on the reticle, and second light detector means having a light detecting surface disposed at a position away from the imaging plane of said projection optical system, for detecting the light intensity distribution on the pupil plane of said projection optical system.

24. An apparatus according to claim 21, wherein said light detecting means comprises a light blocking plate with a pinhole disposed at the imaging plane, and a plurality of photoelectric converting elements arrayed at a position away from the imaging plane for detecting light passing through the reticle pattern, through said projection optical system and through the pinhole of said light blocking plate, wherein (i) the light intensity distribution on the pupil plane of said projection optical system is determined on the basis of an output distribution of said photoelectric converting elements, (ii) the light intensity on the reticle is determined by using the sum of outputs of said photoelectric converting elements, and (iii) said light blocking plate and said photoelectric converting elements are movable as a unit along the imaging plane.

25. An apparatus according to claim 22, wherein said optical characteristic correcting means performs one of (i) moving the reticle and said projection optical system along an optical axis direction and (ii) moving the substrate along the optical axis direction thereby to correct the change of the imaging plane and to register the surface of the substrate and the imaging plane.

26. An apparatus according to claim 22, wherein said optical characteristic correcting means changes a focal distance of said projection optical system to correct the change of the image plane and to register the surface of the substrate and the imaging plane.

27. An apparatus according to claim 22, wherein said optical characteristic correcting means moves one of the reticle and a lens of said projection optical system along an optical axis direction to correct the change of the projection magnification.

28. An apparatus according to claim 22, wherein said optical characteristic correcting means changes a focal distance of said projection optical system to correct the change in the projection magnification.

29. A projection exposure apparatus comprising:
an illumination optical system for illuminating a reticle;
a projection optical system for projecting a pattern of the reticle onto a substrate; and
optical characteristic calculating means for calculating an amount of change in optical characteristic of said projection optical system due to the projection of the reticle pattern onto the substrate through said projection optical system, wherein said optical characteristic calculating means comprises light detecting means for detecting an intensity distribution of the light from the reticle pattern on a pupil plane of said projection optical system, and determines a value of a predetermined parameter in a calculation formula to be used in the calculation of the amount of change of optical characteristic, in accordance with the intensity distribution detected by said light detecting means.

30. An apparatus according to claim 29, wherein said light detecting means detects an intensity distribution on the reticle.

31. An apparatus according to claim 29, wherein said optical characteristic calculating means calculates at least one of (i) the amount of change of an imaging plane of said projection optical system and (ii) the amount of change of projection magnification of said projection optical system.

32. An apparatus according to claim 30, wherein said light detecting means comprises first light detector means having a light detecting surface disposed at the imaging plane of said projection optical system, for detecting the light intensity distribution on the reticle, and second light detector means having a light detecting surface disposed at a position away from the imaging plane of said projection optical system, for detecting the light intensity distribution on the pupil plane of said projection optical system.

33. An apparatus according to claim 30, wherein said light detecting means comprises a light blocking plate with a pinhole disposed at the imaging plane, and a plurality of photoelectric converting elements arrayed at a position away from the imaging plane for detecting light passing through the reticle pattern, through said projection optical system and through the pinhole of said light blocking plate, wherein (i) the light intensity distribution on the pupil plane of said projection optical system is determined on the basis of an output distribution of said photoelectric converting elements, (ii) the light intensity on the reticle is determined by using the sum of outputs of said photoelectric converting elements, and (iii) said light blocking plate and said photoelectric converting elements are movable as a unit along the imaging plane.

34. A projection exposure apparatus comprising:

an illumination optical system for illuminating a reticle;

a projection optical system for projecting a pattern of the reticle onto a substrate;

optical characteristic calculating means for calculating the amount of change in optical characteristic of said projection optical system due to the projection of the reticle pattern onto the substrate through said projection optical system, wherein said optical characteristic calculating means includes light detecting means for detecting an intensity distribution of the light from the reticle pattern on a pupil plane of said projection optical system, and determines a value of a predetermined parameter in a calculation formula to be used in the calculation of the amount of change of optical characteristic, in accordance with the intensity distribution detected by said light detecting means; and optical characteristic correcting means for substantially correcting the change in optical characteristic of said projection optical system in accordance with an output of said optical characteristic detecting means.

35. An apparatus according to claim 34, wherein said light detecting means detects an intensity distribution on the reticle.

36. An apparatus according to claim 34, wherein said optical characteristic calculating means calculates at least one of (i) the amount of change of an imaging plane of said projection optical system and (ii) the amount of change of projection magnification of said projection optical system.

37. An apparatus according to claim 35, wherein said light detecting means comprises first light detector means having a light detecting surface disposed at the imaging plane of said projection optical system, for detecting the light intensity distribution on the reticle, and second light detector means having a light detecting surface disposed at a position away from the imaging plane of said projection optical system, for detecting the light intensity distribution on the pupil plane of said projection optical system.

38. An apparatus according to claim 35, wherein said light detecting means comprises a light blocking plate with a pinhole disposed at the imaging plane, and a plurality of photoelectric converting elements arrayed at a position away from the imaging plane for detecting light passing through the reticle pattern, through said projection optical system and through the pinhole of said light blocking plate, wherein (i) the light intensity distribution on the pupil plane of said projection optical system is determined on the basis of an output distribution of said photoelectric converting elements, (ii) the light intensity on the reticle is determined by using the sum of outputs of said photoelectric converting elements, and (iii) said light blocking plate and said photoelectric converting elements are movable as a unit along the imaging plane.

39. An apparatus according to claim 36, wherein said optical characteristic correcting means performs one of (i) moving the reticle and said projection optical system along an optical axis direction and (ii) moving the substrate along the optical axis direction to thereby correct the change of the imaging plane and to register the surface of the substrate and the imaging plane.

40. An apparatus according to claim 36, wherein said optical characteristic correcting means changes a focal distance of said projection optical system to correct the change of the image plane and to register the surface of the substrate and the imaging plane.

41. An apparatus according to claim 36, wherein said optical characteristic correcting means moves one of the reticle and a lens of said projection optical system along an optical axis direction to correct the change of the projection magnification.

42. An apparatus according to claim 36, wherein said optical characteristic correcting means changes a focal distance of said projection optical system to correct the change in the projection magnification.

43. A device manufacturing method for manufacturing a device such as at least one of an integrated circuit, a large scale integrated circuit, a liquid crystal device and a magnetic head, said method comprising:

transferring a device pattern of a mask onto a photosensitive substrate by projecting the device pattern onto the substrate through the projection optical system of the projection exposure apparatus as recited in any one of claims 1 through 43.

* * * * *

UNITED STATES PATENT AND TRADEMARK OFFICE
CERTIFICATE OF CORRECTION

PATENT NO. : 5,925,887

DATED : July 20, 1999

INVENTOR(S): FUMIO SAKAI, ET AL.

It is certified that error appears in the above-identified patent and that said Letters Patent is hereby corrected as shown below:

COLUMN 6,
Line 13, "typical type" should read --typical--.

COLUMN 8,
Line 3, "applicable also" should read --also applicable--.

COLUMN 10,
Line 41, "pattern" should read --pattern,--.

COLUMN 11,
Line 9, "said" should read --said projection--.

COLUMN 14,
Line 61, "claims 1 through 43." should read --claims 1 through 42.--.

Signed and Sealed this

Twenty-fourth Day of October, 2000

Attest:

Q. TODD DICKINSON

*Attesting Officer*  *Director of Patents and Trademarks*